(12) United States Patent
Hatanaka (10) Patent No.: US 10,320,368 B2
(45) Date of Patent: Jun. 11, 2019

(54) RING OSCILLATOR CIRCUIT AND CLOCK SIGNAL GENERATION CIRCUIT

(71) Applicant: SEIKO EPSON CORPORATION, Tokyo (JP)

(72) Inventor: Koichi Hatanaka, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 156 days.

(21) Appl. No.: 15/446,391

(22) Filed: Mar. 1, 2017

(65) Prior Publication Data

US 2017/0264272 A1 Sep. 14, 2017

(30) Foreign Application Priority Data

Mar. 11, 2016 (JP) ................................. 2016-048129

(51) Int. Cl.

| H03K 3/00 | (2006.01) |
|---|---|
| H03K 3/03 | (2006.01) |
| H03L 1/02 | (2006.01) |
| H03L 1/04 | (2006.01) |
| H03K 3/011 | (2006.01) |
| H03L 7/093 | (2006.01) |
| H03L 7/099 | (2006.01) |

(52) U.S. Cl.
CPC ............. *H03K 3/0315* (2013.01); *H03K 3/00* (2013.01); *H03K 3/011* (2013.01); *H03L 1/028* (2013.01); *H03L 1/04* (2013.01); *H03L 7/093* (2013.01); *H03L 7/0995* (2013.01)

(58) Field of Classification Search
CPC ........ H03K 3/0315; H03K 3/00; H03K 3/011; H03L 7/0995; H03L 7/18; H03L 7/0802; H03L 7/085; H03L 7/093; H03L 7/08; H03L 7/099; H03L 2207/50; H03L 7/06; H03L 1/04; H03L 1/028
USPC ...... 331/57, 45; 327/158, 291; 375/291, 295
See application file for complete search history.

(56) References Cited

U.S. PATENT DOCUMENTS

2009/0140820 A1* 6/2009 Tatschl-Unterberger ....................
H03K 3/0315
331/57

FOREIGN PATENT DOCUMENTS

| JP | 2001-230667 A | 8/2001 |
|---|---|---|
| JP | 2011-061462 A | 3/2011 |

* cited by examiner

*Primary Examiner* — Arnold M Kinkead
(74) *Attorney, Agent, or Firm* — Oliff PLC (57) ABSTRACT

A ring oscillator circuit includes a plurality of first delay circuits each including X first delay elements, and a second delay circuit including a plurality of second delay elements different in delay amount from each other arranged in parallel to each other so as to be alternatively loaded, the plurality of first delay circuits and the second delay circuit are configured to be connected to each other in a ring-like manner, and X is an integer fulfilling $X \geq 1$.

11 Claims, 5 Drawing Sheets

RING OSCILLATOR CIRCUIT AND CLOCK SIGNAL GENERATION CIRCUIT

BACKGROUND

1. Technical Field

The present invention relates to a ring oscillator, a clock signal generation circuit, and so on.

2. Related Art

As an oscillation circuit for generating a clock signal with a predetermined frequency, there is well known a ring oscillator having a plurality of delay elements connected to each other in a ring-like manner (see e.g., JP-A-2011-61462).

As another oscillation circuit, a temperature compensated crystal oscillator (TCXO) is also known well. In comparison between the ring oscillator circuit and the TCXO, the TCXO is superior in frequency accuracy, but in low power consumption, the ring oscillator circuit is superior. Therefore, which is used as the generation circuit of the clock signal is determined depending on the electronic apparatus to be applied.

Incidentally, clock signals are used in all electronic apparatuses, and among them, a positioning satellite signal receiver represented by a GPS (Global Positioning System) receiver can be said to be a good example requiring a highly accurate clock signal. This is because the clock signal is directly linked to the performance of the electronic apparatus, and in the case of the positioning satellite signal receiver, the accuracy of the clock signal directly effects the positioning accuracy. On the other hand, in the case of an electronic apparatus operating with a battery, in order to make long hours of operation possible, reduction of the power consumption is required. Therefore, it is also desirable in generation of the clock signal that the power consumption is as low as possible. Also in the positioning satellite signal receiver described above, since such a receiver is configured as a portable or small-sized electronic apparatus operating with a battery in many cases, the reduction of the power consumption is one of important matters. In comparison between the ring oscillator circuit and the TCXO as a generation circuit of the clock signal, there has been a problem that the ring oscillator circuit is lower in power consumption, but is lower in frequency accuracy of the clock signal, and the TCXO is higher in frequency accuracy of the clock signal, but is higher in power consumption.

In particular, as a problem of the frequency accuracy of the clock signal generated by the ring oscillator circuit, there has been the following problem. That is, since the related-art ring oscillator circuit is configured by connecting a plurality of delay elements having a uniform delay amount to each other in a ring-like manner, it is theoretically possible to improve the frequency accuracy of the clock signal if using the delay elements smaller in delay amount.

However, since reduction of the delay amount depends on the miniaturization manufacturing technology for a semiconductor, there is a technical limitation. Further, since the smaller the delay amount of the delay element is, the higher the manufacturing cost is, the semiconductor circuit manufactured using the miniaturization manufacturing technology, namely the delay element small in delay amount, is high in manufacturing cost, and is expensive.

SUMMARY

An advantage of some aspects of the invention is to provide a technology of a novel ring oscillator circuit improved in frequency accuracy of the clock signal generated by the ring oscillator circuit.

A first aspect of the invention is directed to a ring oscillator circuit including a plurality of first delay circuits each including X (X is an integer fulfilling X≥1) first delay elements, and a second delay circuit including a plurality of second delay elements different in delay amount from each other arranged in parallel to each other so as to be alternatively loaded, wherein the plurality of first delay circuits and the a second delay circuit are configured to be connected to each other in a ring-like manner.

According to the first aspect of the invention, there is realized a ring oscillator circuit improved in the frequency accuracy of the clock signal generated by the ring oscillator circuit. Specifically, the ring oscillator circuit is constituted by the first delay circuit and the second delay circuit connected to each other in a ring-like manner, but in the second delay circuit, it results that there is provided delay as much as the delay amount of the delay element alternatively loaded.

Here, since the delay amounts of the respective second delay elements of the second delay circuit are different from each other, by changing the second delay element alternatively loaded, it is possible to make the delay amount in the second delay circuit different.

Therefore, it is possible to control the oscillation frequency of the ring oscillator circuit with the frequency accuracy corresponding to the difference between the delay amounts of the respective second delay elements of the second delay circuit.

Therefore, it is possible to realize the ring oscillator circuit introducing an entirely-new concept with which the conventional wisdom of manufacturing the delay element having the delay amount reduced as much as possible becomes unnecessary.

As a second aspect of the invention, the ring oscillator circuit according to the first aspect of the invention may be configured such that the second delay circuit is singly provided.

According to the second aspect of the invention, it is possible to configure the ring oscillator circuit having one second delay circuit.

As a third aspect of the invention, the ring oscillator circuit according to the first aspect or the second aspect of the invention may be configured such that the plurality of second delay elements has respective delay amounts, which are no smaller than 1 time and no larger than 2 times of a delay amount of the first delay element, and are different from each other.

According to the third aspect of the invention, the delay amount of the second delay element is no smaller than 1 time and no larger than 2 times of the delay amount of the first delay element, and it is sufficient for the second delay element to be larger in delay amount than the first delay element. Therefore, it is possible to manufacture the second delay elements at a moderate price without depending on the miniaturization manufacturing technology of a semiconductor. Therefore, it becomes possible to manufacture the ring oscillator circuit, which is improved in frequency accuracy of the clock signal generated by the ring oscillator circuit, at a moderate price without depending on the miniaturization manufacturing technology of a semiconductor.

As a fourth aspect of the invention, the ring oscillator circuit according to any one of the first aspect through the third aspect of the invention may be configured such that the plurality of second delay elements is respectively formed of field-effect transistors different in gate length from each other.

According to the fourth aspect of the invention, by making the field-effect transistors different in gate length from each other, it is possible to form the second delay elements different in delay amount from each other.

As a fifth aspect of the invention, the ring oscillator circuit according to any one of the first aspect through the fourth aspect of the invention may be configured such that the plurality of second delay elements is respectively formed of field-effect transistors different in gate width from each other.

According to the fifth aspect of the invention, by making the field-effect transistors different in gate width from each other, it is possible to form the second delay elements different in delay amount from each other.

As an sixth aspect of the invention, it is possible to configure a clock signal generation circuit including a ring oscillator circuit including a plurality of first delay circuits each including X (X is an integer fulfilling X≥1) first delay elements, and a second delay circuit including a plurality of second delay elements different in delay amount from each other arranged in parallel to each other so as to be alternatively loaded, wherein the plurality of first delay circuits and the second delay circuit are configured to be connected to each other in a ring-like manner, and a control section adapted to alternatively select the second delay element to be loaded among the plurality of second delay elements in accordance with a given clock signal so that the ring oscillator circuit generates a clock signal in accordance with the given clock signal.

According to the sixth aspect of the invention, since the clock signal corresponding to the given clock signal can be generated, by, for example, using a relatively accurate clock signal as the given clock signal, it is possible to realize the clock signal generation circuit for generating the clock signal having high frequency accuracy.

BRIEF DESCRIPTION OF TEE DRAWINGS

The invention will now be described with reference to the accompanying drawings, wherein like numbers reference like elements.

DESCRIPTION OF EXEMPLARY EMBODIMENTS

Ring Oscillator Circuit

Figure 1:
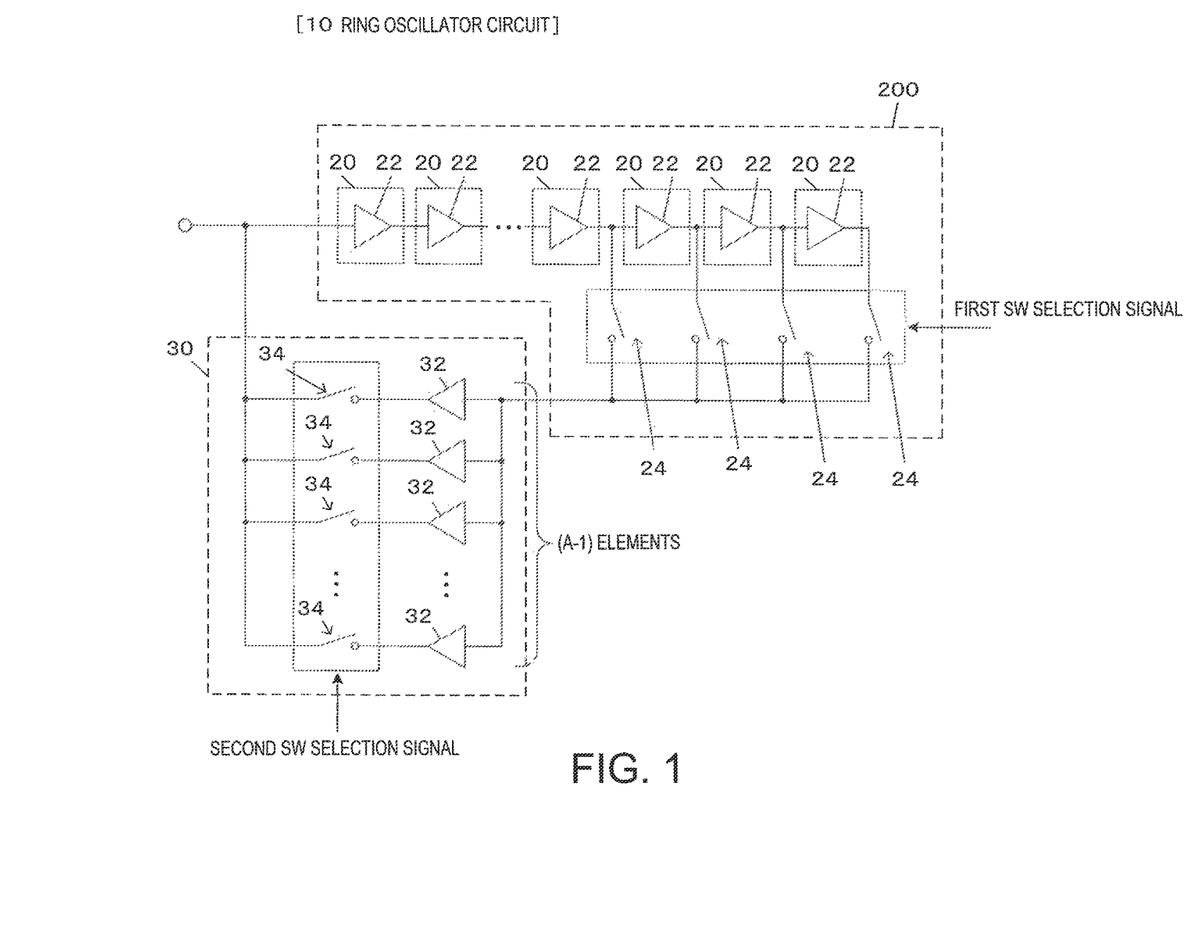
FIG. 1 is a circuit configuration diagram of a ring oscillator circuit.

FIG. 1 is a circuit configuration diagram of a ring oscillator circuit 10 according to the present embodiment. The ring oscillator circuit 10 is constituted by a plurality of first delay circuits 20 and one or more second delay circuits 30 connected to each other in a ring-like manner. In the present embodiment, the plurality of first delay circuits 20 is connected in series to each other to constitute a first delay circuit group 200. Then, one second delay circuit 30 is connected in series to the first delay circuit group 200 to constitute the ring oscillator circuit 10 in a ring-like manner.

In the present embodiment, it is assumed that each of the first delay circuits 20 has one first delay element 22, but it is also possible to adopt a configuration having a plurality of first delay elements 22 connected in series to each other. The first delay elements 22 are the same in design circuit configuration as each other, and are therefore all the same in design delay amount as each other. Here, the fact that the delay amounts are the same as each other not only means that the delay amounts are strictly the same as each other, but also means that the delay amounts are roughly the same as each other allowing inclusion of a minute difference no larger than several %. On the output side of each of the first delay circuits 20 in a posterior part among these first delay circuits 20, there is connected a first switch 24 for disconnecting the first delay circuits 20 posterior to the corresponding first delay circuit 20, and connecting the output to the second delay circuit 30. These first switches 24 are controlled in ON/OFF state by a first SW (switch) selection signal so that one of the first switches 24 alone is set to the ON state, and the rest of them are all set to the OFF state. In other words, the first SW selection signal controls the number of connection stages of the first delay circuits 20.

The second delay circuit 30 is constituted by second delay elements 32, all of which are different in delay amount from each other, and are connected in parallel to each other. A second switch 34 is connected in series to each of the second delay elements 32. These second switches 34 are controlled in ON/OFF state by a second SW selection signal so that one of the second switches 34 alone is set to the ON state, and the rest of them are all set to the OFF state. In other words, the second SW selection signal performs the control so that either one of the second delay elements 32 is connected, and it can be said that the second delay circuit 30 is configured including the delay elements different in delay amount from each other connected in parallel to each other so as to be able to be selectively loaded.

The delay amount of the second delay element 32 is no smaller than 1 time and no larger than 2 times of the delay amount of the first delay element 22. Specifically, assuming that the delay amount (which can also be referred to as delay time) of the first delay element 22 is "N," and the number of second delay elements 32 provided to the second delay circuit 30 is "(A−1)" (A=2, 3, . . . ), the second delay elements 32 are configured so that the delay amount $D_i$ of the i-th (i=1, . . . , A−1) second delay element 32 becomes $D_i = N + (N/A) \times i$. Specifically, the second delay elements 32 are configured so that the delay amounts are different by a delay amount obtained by equally dividing the delay amount of one first delay element 22 by the number of the second delay elements 32.

The first delay elements 22 and the second delay elements 32 are each configured including a field-effect transistor, and the delay amount thereof can be determined mainly by the gate dimensions of the field-effect transistor. Specifically, it is assumed that the first delay elements 22 are formed setting the gate dimensions (the gate length L and the gate width W) of the field-effect transistor to the smallest manufacturable dimensions. Compared to the first delay elements 22, the second delay elements 32 can be formed so as to increase the gate dimensions of the field-effect transistor. The second delay elements 32 are formed so that, for example, the gate width W is elongated although the gate length L is the same, or the gate length L is elongated, although, the gate width W is the same. By forming the field-effect transistor to have the large gate dimensions, the delay amount of the second delay element 32 becomes larger than the delay amount of the first delay element 22. In manufacturing the second delay elements 32, manufacturing technology finer than the miniaturization manufacturing technology of a semiconductor used in the manufacture of the first delay element 22 is not required. This is because the second delay elements 32 are manufactured with the gate dimensions made larger than those of the first delay elements 22.

In the ring oscillator circuit 10, the oscillation frequency can be controlled with the delay amount "N/A" smaller than the delay amount "N" of the first delay elements 22. In other words, in the first delay circuit group 200, by changing the number of connection stages of the first delay circuits 20 by one stage, it is possible to make the delay amount of the whole of the circuit change by the delay amount of the first delay circuit 20. If one first delay circuit 20 is formed of one first delay element 22, the delay amount can be changed by the delay amount N of one first delay element 22 as a minimum unit. Therefore, the oscillation frequency can be controlled with a period of T fulfilling T/2=N with respect to the input signal.

In contrast, the delay amount of the whole of the second delay circuit 30, to which the output signal of the first delay circuit group 200 is input, is the delay amount itself of the second delay element 32 thus connected. By switching the second delay element 32 to be connected, for example, from the i-th second delay element 32 to the (i+1)-th second delay element 32, the delay amount of the whole of the circuit changes from the delay amount "$D_i=N+(N/A)\times i$" of the i-th second delay element 32 to the delay amount "$D_{i+1}=N+(N/A)\times(i+1)$" of the (i+1)-th second delay element 32. In other words, the delay amount of the whole of the second delay circuit 30 can be changed by $\Delta D="D_{i+1}-D_i"=N/A$ as a minimum unit. Therefore, it is possible for the second delay circuit 30 to control the oscillation frequency with a period of T fulfilling T/2=N/A with respect to the input signal input from the first delay circuit group 200. Therefore, in the ring oscillator circuit 10, defining the interval of the oscillation period which can be controlled using the first delay circuits 20 as $\Delta T$, the oscillation period can be controlled with an interval of "$\Delta T/A$" obtained by dividing the period interval $\Delta T$ into A equal parts.

Clock Signal Generation Circuit

Figure 2:
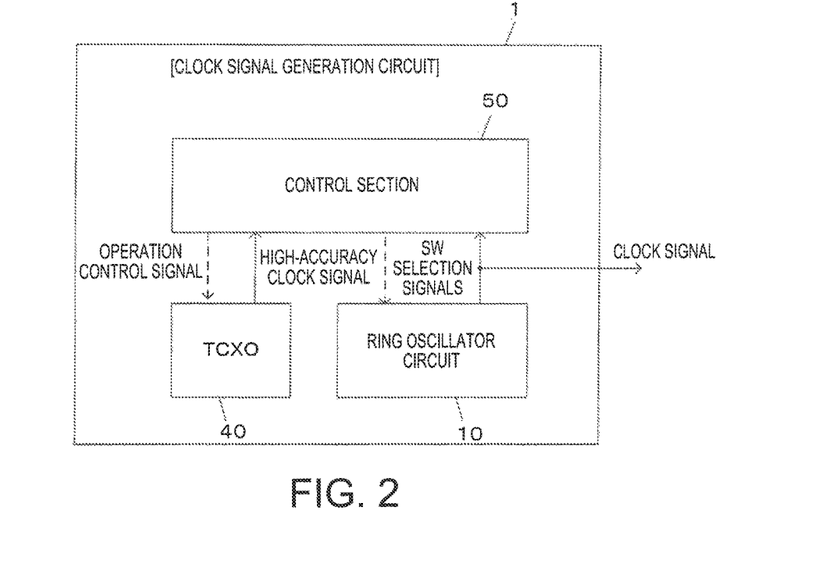
FIG. 2 is a diagram showing a configuration diagram of a clock signal generation circuit.

FIG. 2 is a configuration diagram of a clock signal generation circuit 1 having the ring oscillator circuit 10. The clock signal generation circuit 1 has the ring oscillator circuit 10, a temperature compensated crystal oscillator (TCXO) 40, and a control section 50, and generates and then outputs the clock signal with a predetermined frequency.

Start and stop of the operation of the TCXO 40 are controlled in accordance with the an operation control signal from the control section 50, and the TCXO 40 outputs the oscillation signal with the predetermined frequency as a high-accuracy clock signal. In the ring oscillator circuit 10, ON/OFF of each of the first switches 24 is controlled by the first SW selection signal from the control section 50, and ON/OFF of each of the second switches 34 is controlled by the second SW selection signal, and thus the oscillation frequency is controlled.

In the clock signal generation circuit 1, in the normal state, the TCXO 40 is stopped, and the oscillation signal of the ring oscillator circuit 10 is output to the outside of the circuit as a clock signal. This is because the ring oscillator circuit 10 is lower in power consumption than the TCXO 40. Further, the ring oscillator circuit 10 is capable of outputting the clock signal having a high-accuracy oscillation frequency, but requires a clock signal to be the reference the oscillation action. Therefore, the control section 50 performs a setting process of setting the oscillation frequency of the ring oscillator circuit 10 at the startup of the clock sign 1 generation circuit 1 or desired timing using the oscillation frequency of the TCXO 40.

In the setting process, the control section 50 obtains the difference $\Delta f$ between the oscillation frequency of the TCXO 40 and the oscillation frequency of the ring oscillator circuit 10, and adjusts the oscillation frequency of the ring oscillator circuit 10 in accordance with the frequency difference $\Delta f$. Specifically, in the case in which the oscillation frequency of the ring oscillator circuit 10 is higher, the control section 50 outputs the first SW selection signal for changing the number of connection stages of the first delay circuits 20, or the second SW selection signal for switching the second delay element 32 to be loaded in the second delay circuit 30 so as to increase the delay amount, and in contrast, in the case in which the oscillation frequency of the ring oscillator circuit 10 is lower, the control section 50 outputs the first SW selection signal or the second SW selection signal so as to decrease the delay amount.

Farther, obtaining the frequency difference $\Delta f$ can be defined as calculating the numerical value of the frequency difference, but the frequency difference is not required to be calculated as the numerical value. In short, it is sufficient that it is possible to make a high-low determination on which of the oscillation frequency of the TCXO 40 and the oscillation frequency of the ring oscillator circuit 10 is higher. In that case, firstly, the first SW selection signal is changed to determine a value "V" so that the oscillation frequency of the TCXO 40 falls within a range between the frequency obtained when the number of connection stages of the first delay circuits 20 is "V" and the frequency obtained when the number of connection stages is "V+1." Then, it is sufficient for the control section 50 to change the second SW selection signal to select the second delay element 32 so as to obtain a frequency equal or the closest to the oscillation frequency of the TCXO 40 while keeping the first SW selection signal corresponding to "V" thus determined. Regarding the selection of the second delay element 32 corresponding to the closest frequency, it is sufficient to select the "W"-th or "W+1"-th second delay element 32 wherein the oscillation frequency of the TCXO 40 falls within the range between the frequency corresponding to the "W"-th second delay element 32 and the frequency corresponding to the "W+1"-th second delay element 32.

Flow of Process

Figure 3:
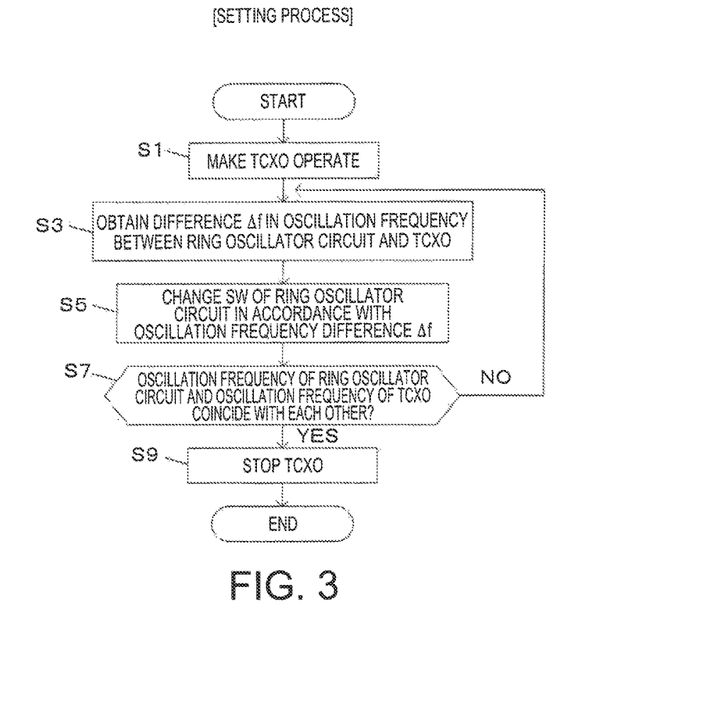
FIG. 3 is a flowchart of a calibration process.

FIG. 3 is a flowchart for explaining the flow of the setting process by the control section 50. The control section 50, firstly, makes the TCXO 40 operate (step S1). Then, the control section 50 obtains (step S3) the difference $\Delta f$ between the oscillation frequency of the TCXO 40 and the oscillation frequency of the ring oscillator circuit 10. Then, the control section 50 changes (step S5) the first SW selection signal and the second SW selection signal in the ring oscillator circuit 10 in accordance with the oscillation frequency difference $\Delta f$ thus obtained.

As a result, the control section 50 determines whether or not the oscillation frequency of the ring oscillator circuit 10 and the oscillation frequency of the TCXO 40 coincide with each other, and then returns to the step S3 if these fail to coincide with each other (NO in the step S7). If these frequencies coincide with each other (YES in the step S7), the control section 50 stops (step S9) the TCXO 40. After the process described above is completed, the control section 50 ends the setting process.

Functions and Advantages

As described above, according to the present embodiment, there is realized the ring oscillator circuit 10 improved in the frequency accuracy of the oscillation frequency while keeping the advantage such as low power consumption. Specifically, it results that the output signal of the first delay circuit group 200 is delayed as much as the delay amount of the second delay element 32 alternatively selected in the second delay circuit 30. Here, since the delay amounts of the respective second delay elements 32 are different from each other, by changing the second delay element 32 alternatively selected, it is possible to make the delay amount of the second delay circuit 30 different. Therefore, it is possible to control the oscillation frequency of the ring oscillator circuit 10 with the frequency accuracy corresponding to the difference between the delay amounts of the respective second delay elements 32 of the second delay circuit 30. Further, since the delay amount of the second delay element 32 is no smaller than 1 time and no larger than 2 times of the delay amount of the first delay element 22, it is sufficient for the second delay elements 32 to be larger in delay amount than the first delay circuit 20. Therefore, it is possible to manufacture the second delay elements 32 at a moderate price without depending on the miniaturization manufacturing technology of a semiconductor. Therefore, it becomes possible to manufacture the ring oscillator circuit 10, which is improved in frequency accuracy of the clock signal generated by the ring oscillator circuit 10, at a moderate price without depending on the miniaturization manufacturing technology of a semiconductor.

It should be noted that it is obvious that the applicable embodiment of the invention is not limited to the embodiment described above, but can arbitrarily be modified within the scope or the spirit of the invention.

A. Plurality of Second Delay Circuits

Although in the embodiment described above, the ring oscillator circuit 10 provided with a single second delay circuit 30 is described, it is also possible to assume that two or more second delay circuits 30 are provided.

Figure 4:
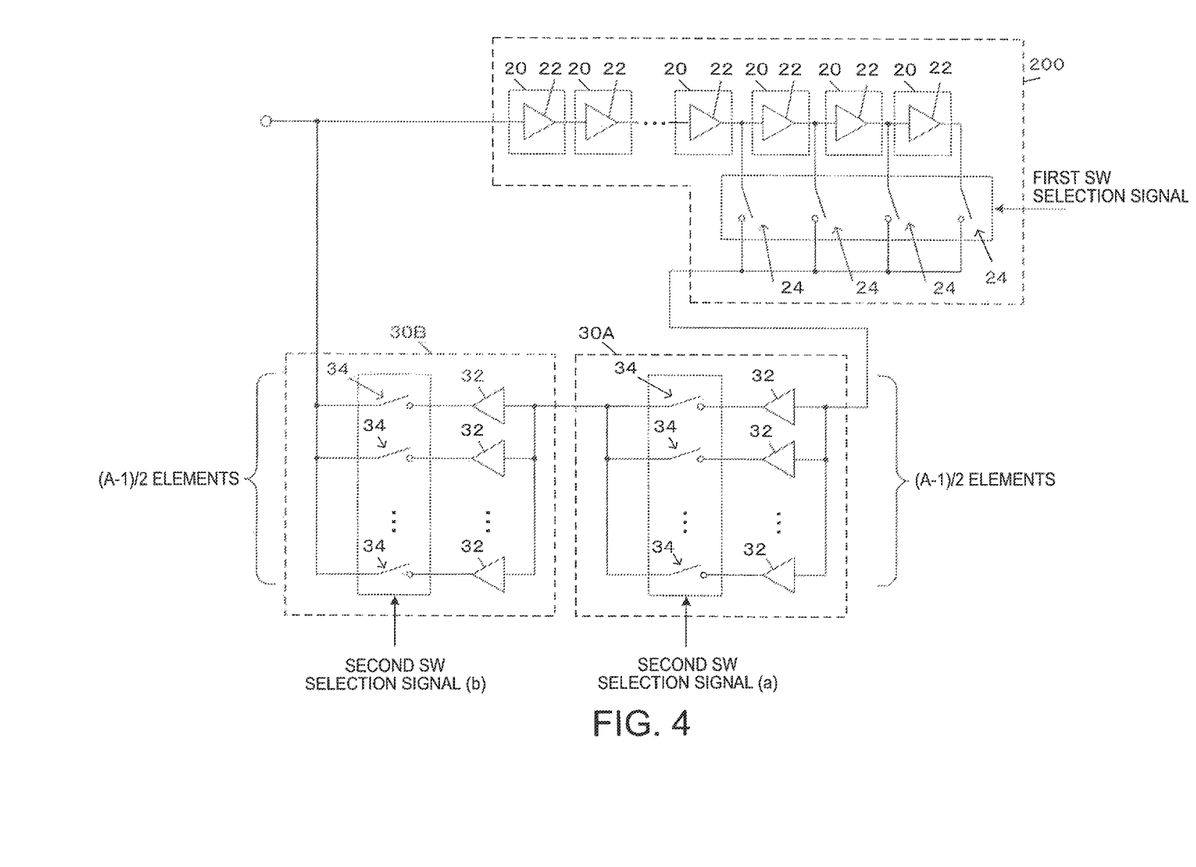
FIG. 4 is a diagram showing another configuration example of the ring oscillator circuit.

FIG. 4 shows an example of the ring oscillator circuit 10 provided with two second delay circuits 30A, 30B. The ring oscillator circuit 10 is constituted by the first delay circuit group 200 and the second delay circuits 30A, 30B connected to each other in a ring-like manner. The second delay circuits 30A, 3DB can each be constituted by, for example, "(A−1)/2" (A is an odd number) second delay elements 32 connected in parallel to each other. Similarly to the embodiment described above, the delay amounts of the respective second delay elements 32 are different from each other, and are no smaller than 1 time and no larger than 2 times of the delay amount N of the first delay element 22. In each of the second delay circuits 30A, 30B, the delay amount $D_i$ of the i-th (i=1, . . . , (A−1)/2) second delay element 32 becomes $D_i$=N+(N/A)×i. In the second delay circuits 30A, 30B, one second delay element 32 each is selected and then connected in accordance with a second SW selection signal (a) and a second SW selection signal (b), respectively. The output signal of the first delay circuit group 200 is delayed as much as the delay amounts of the second delay elements 32 connected in the respective second delay circuits 30A, 30B. Therefore, in the ring oscillator circuit 10, the oscillation frequency can be controlled with the frequency accuracy corresponding to the minimum unit of the delay amount changed by switching the second delay elements 32 connected in the respective second delay circuits 30A, 30B.

B. Stop Operation of First Delay Circuit 20 Not to be Used

Figure 5:
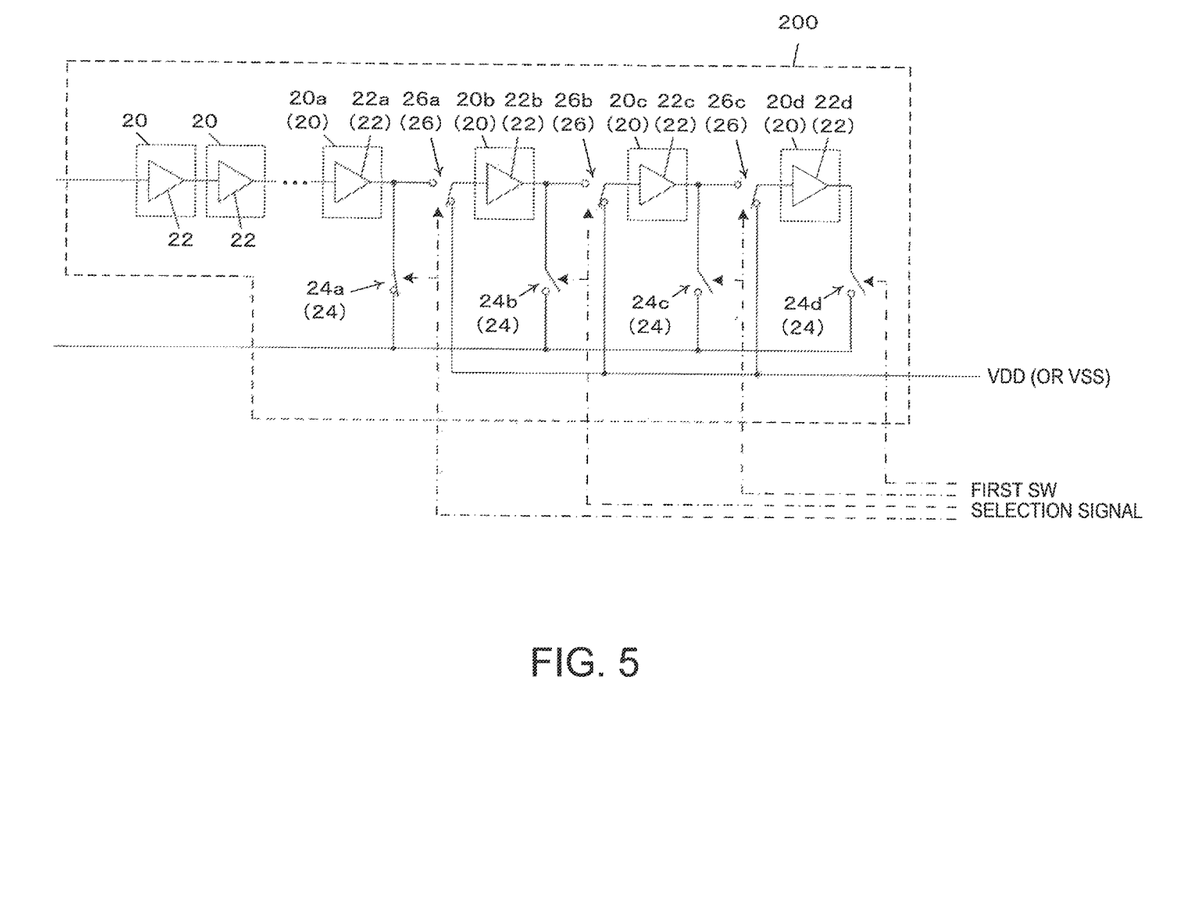
FIG. 5 is a diagram showing another configuration example of a first delay circuit group.

Although it is assumed that the number of connection stages of the first delay circuit 20 is controlled by the first SW selection signal, in this case, it is also possible to adopt a circuit configuration of stopping the operation of the first delay circuit 20 not to be connected (used). For example, as shown in FIG. 5, there is adopted a configuration in which third switches 26a through 26c are respectively disposed between the first delay circuits 20a through 20d, the output side of which the first switches 24 are respectively connected to, to thereby be switchably connected to a predetermined electrical potential (VDD as an H potential or VSS as an L potential). Then, in the case in which the first switch 24a is set to the ON state by the first SW selection signal, the third switch 26a is switched to be connected to the predetermined electrical potential. In the case in which the first switch 24b is set to the ON state, the third switch 26b is switched to be connected to the predetermined electrical potential. In the case in which the first switch 24c is set to the ON state, the third switch 26c is switched to be connected to the predetermined electrical potential. Thus, it is possible to stop the operation of the first delay circuits 20 located in the posterior stage of the third switch 26 switched to the predetermined electrical potential. In the example shown in FIG. 5, the first switch 24a is set to the ON state and the third switch 26a is connected to the predetermined electrical potential. Thus, the operation of the first delay circuits 20b, 20c, and 20d not to be used is stooped.

C. Nonuse of Second Delay Circuit 30

Figure 6:
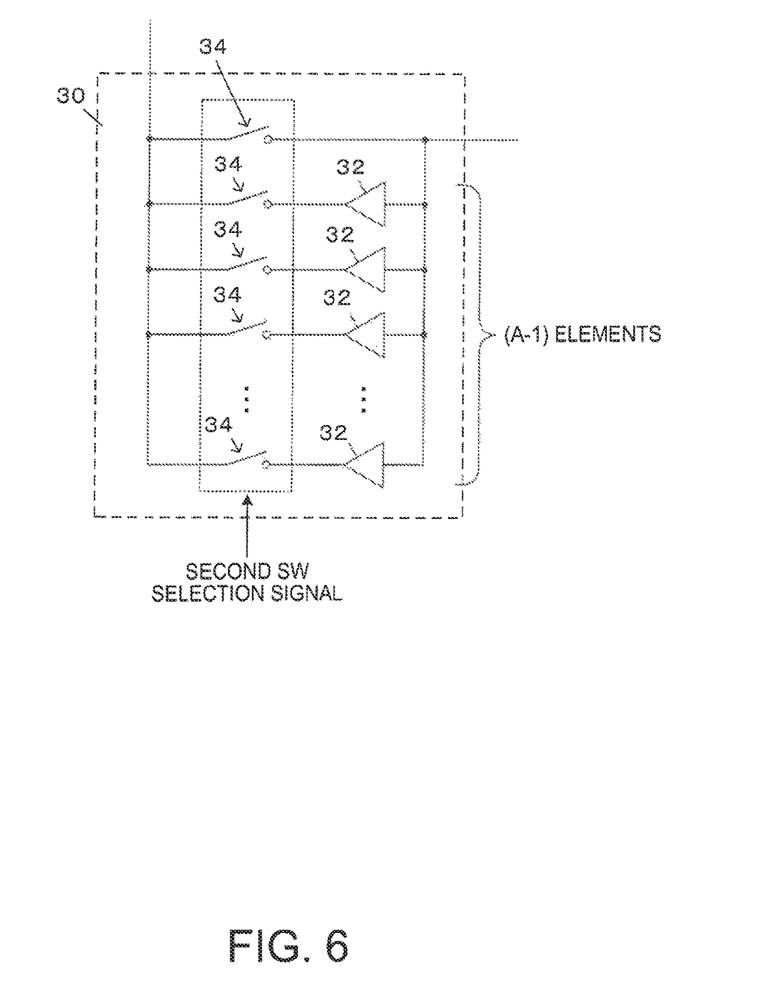
FIG. 6 is a diagram showing another configuration example of a second delay circuit.

It is also possible to arrange that there is further provided a switch for shorting (or can also be said "bypassing" the second delay circuit 30 to directly connect the output and the output of the first delay circuit group 200 to each other. For example, as shown in FIG. 6, it is also possible to arrange that there is disposed an additional second switch 34 for shorting the second delay circuit 30 without selecting any second delay element 32.

The entire disclosure of Japanese Patent Application No. 2016-048129, filed Mar. 11, 2016 is expressly incorporated by reference herein.

What is claimed is:

1. A ring oscillator circuit comprising:
    a plurality of first delay circuits each including X first delay elements;
    a second delay circuit including a plurality of second delay elements different in delay amount from each other arranged in parallel to each other so as to be alternatively loaded,
    wherein the plurality of first delay circuits and the second delay circuit are configured to be connected to each other in a ring-like manner, and
    X is an integer fulfilling X≥1; and
    a plurality of switches, each of the plurality of switches having a first node and a second node,
    wherein the first node of each of the plurality of switches is connected to an output of each first delay circuit in a subset of the plurality of first delay circuits, and the second node of each of the plurality of switches is connected to an input of the each of the plurality of second delay circuits.

2. The ring oscillator circuit according to claim 1, wherein the second delay circuit is singly provided.

3. The ring oscillator circuit according to claim 1, wherein the plurality of second delay elements has respective delay amounts, which are no smaller than 1 time and no larger than 2 times of a delay amount of the first delay element, and are different from each other.

4. The ring oscillator circuit according to claim 1, wherein the plurality of second delay elements is respectively formed of field-effect transistors different in gate length from each other.

5. The ring oscillator circuit according to claim 1, wherein the plurality of second delay elements is respectively formed of field-effect transistors different in gate width from each other.

6. A clock signal generation circuit comprising:
the ring oscillator circuit according to claim 1; and
a control section adapted to alternatively select the second delay element to be loaded among the plurality of second delay elements in accordance with a given clock signal so that the ring oscillator circuit generates a clock signal in accordance with the given clock signal.

7. The clock signal generation circuit according to claim 6, wherein
the second delay circuit is singly provided.

8. The clock signal generation circuit according to claim 6, wherein
the plurality of second delay elements has respective delay amounts, which are no smaller than 1 time and no larger than 2 times of a delay amount of the first delay element, and are different from each other.

9. The clock signal generation circuit according to claim 6, wherein
the plurality of second delay elements is respectively formed of field-effect transistors different in gate length from each other.

10. The clock signal generation circuit according to claim 6, wherein
the plurality of second delay elements is respectively formed of field-effect transistors different in gate width from each other.

11. A ring oscillator circuit comprising:
a plurality of first delay circuits each including X first delay elements;
a second delay circuit including a plurality of second delay elements different in delay amount from each other arranged in parallel to each other so as to be alternatively loaded,
wherein the plurality of first delay circuits and the second delay circuit are configured to be connected to each other in a ring-like manner, and
X is an integer fulfilling X≥1;
a plurality of first switches, each of the plurality of first switches having a first node and a second node,
wherein the first node of each of the plurality of first switches is connected to an output of each first delay circuit in a subset of the plurality of first delay circuits, and the second node of each of the plurality of switches is connected to an input of the each of the plurality of second delay circuits; and
a plurality of second switches, each of the plurality of second having a first node and a second node,
wherein the first node of each of the plurality of second switches is connected to an input of a first delay circuit of the plurality of first delay circuits, and the second node of each of the plurality of second switches is connected to an input of each of the plurality of second delay circuits.

* * * * *